United States Patent
Wei et al.

(10) Patent No.: US 11,532,662 B2
(45) Date of Patent: Dec. 20, 2022

(54) METHOD OF FORMING IMAGE SENSOR DEVICE

(71) Applicant: TAIWAN SEMICONDUCTOR MANUFACTURING CO., LTD., Hsinchu (TW)

(72) Inventors: Chia-Yu Wei, Tainan (TW); Yen-Liang Lin, Tainan (TW); Kuo-Cheng Lee, Tainan (TW); Hsun-Ying Huang, Tainan (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/183,871

(22) Filed: Feb. 24, 2021

(65) Prior Publication Data
US 2021/0202564 A1    Jul. 1, 2021

Related U.S. Application Data

(62) Division of application No. 15/809,458, filed on Nov. 10, 2017, now Pat. No. 10,943,942.

(51) Int. Cl.
*H01L 27/146* (2006.01)
*H01L 31/103* (2006.01)
(Continued)

(52) U.S. Cl.
CPC .... *H01L 27/14649* (2013.01); *H01L 27/1461* (2013.01); *H01L 27/1463* (2013.01); *H01L 27/1464* (2013.01); *H01L 27/14645* (2013.01); *H01L 27/14698* (2013.01); *H01L 31/035272* (2013.01); *H01L 31/103* (2013.01); *H01L 27/14621* (2013.01); *H01L 27/14627* (2013.01);
(Continued)

(58) Field of Classification Search
CPC ......... H01L 27/14649; H01L 27/14689; H01L 27/14621; H01L 27/14627; H01L 27/1463; H01L 27/14698; H01L 27/14645; H01L 31/0296; H01L 31/028; H01L 31/0312; H01L 31/0304; H01L 31/0336
See application file for complete search history.

(56) References Cited

U.S. PATENT DOCUMENTS

2009/0200625 A1*  8/2009  Venezia ............. H01L 27/1464
                                                       257/432
2012/0320242 A1* 12/2012  Ogita ..................... H04N 5/378
                                                       348/E5.091
(Continued)

*Primary Examiner* — Wasiul Haider
(74) *Attorney, Agent, or Firm* — Maschoff Brennan

(57) ABSTRACT

A method includes providing a semiconductor substrate having a front side surface and a back side surface opposite to the front side surface. A photosensitive region of the semiconductor substrate is etched to form a recess. A semiconductor material is deposited on the semiconductor substrate to form a radiation sensing member filling the recess. The semiconductor material has an optical band gap energy smaller than 1.77 eV. A device layer is formed over the front side surface of the semiconductor substrate and the radiation sensing member. A trench isolation is formed in an isolation region of the semiconductor substrate and extending from the back side surface of the semiconductor substrate.

20 Claims, 13 Drawing Sheets

(51) Int. Cl.
*H01L 31/0352* (2006.01)
*H01L 31/0336* (2006.01)
*H01L 31/028* (2006.01)
*H01L 31/0312* (2006.01)
*H01L 31/0304* (2006.01)
*H01L 31/0296* (2006.01)

(52) U.S. Cl.
CPC ...... *H01L 27/14689* (2013.01); *H01L 31/028* (2013.01); *H01L 31/0296* (2013.01); *H01L 31/0304* (2013.01); *H01L 31/0312* (2013.01); *H01L 31/0336* (2013.01)

(56) References Cited

U.S. PATENT DOCUMENTS

| | | | |
|---|---|---|---|
| 2013/0119234 A1* | 5/2013 | Lee | H01L 31/105 250/214 P |
| 2013/0285130 A1 | 10/2013 | Ting et al. | |
| 2015/0221692 A1 | 8/2015 | Enomoto et al. | |
| 2015/0279880 A1* | 10/2015 | Jangjian | H01L 27/14629 438/73 |
| 2015/0311248 A1 | 10/2015 | Lee et al. | |
| 2015/0372033 A1* | 12/2015 | Cheng | H01L 27/14645 257/435 |
| 2016/0247841 A1 | 8/2016 | Cheng et al. | |
| 2016/0322419 A1* | 11/2016 | Ellis-Monaghan | H01L 27/14694 |
| 2017/0040362 A1* | 2/2017 | Na | H01L 27/14687 |
| 2018/0175095 A1 | 6/2018 | Sallin et al. | |
| 2018/0358392 A1 | 12/2018 | Hsieh | |

\* cited by examiner

METHOD OF FORMING IMAGE SENSOR DEVICE

PRIORITY CLAIM AND CROSS-REFERENCE

The present application is a Divisional Application of the U.S. application Ser. No. 15/809,458, filed Nov. 10, 2017, now U.S. Pat. No. 10,943,942, issued on Mar. 9, 2021, which are herein incorporated by reference in its entirety.

BACKGROUND

An image sensor device, such as a complementary metal-oxide semiconductor (CMOS) image sensor (CIS), an active-pixel sensor (APS), a passive-pixel sensor and a charge-coupled device (CCD) sensor, has been widely used in various electronic products such as a digital camera, a smart phone, a tablet, a car video recorder and other applications. Due to miniaturization trend, the electronic components in the image sensor device and the distances among the electronic components in each pixel unit of the image sensor device become smaller and smaller. How to improve light absorption efficiency of an image sensor device with reduced pixel size has become one of important tasks in related industries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
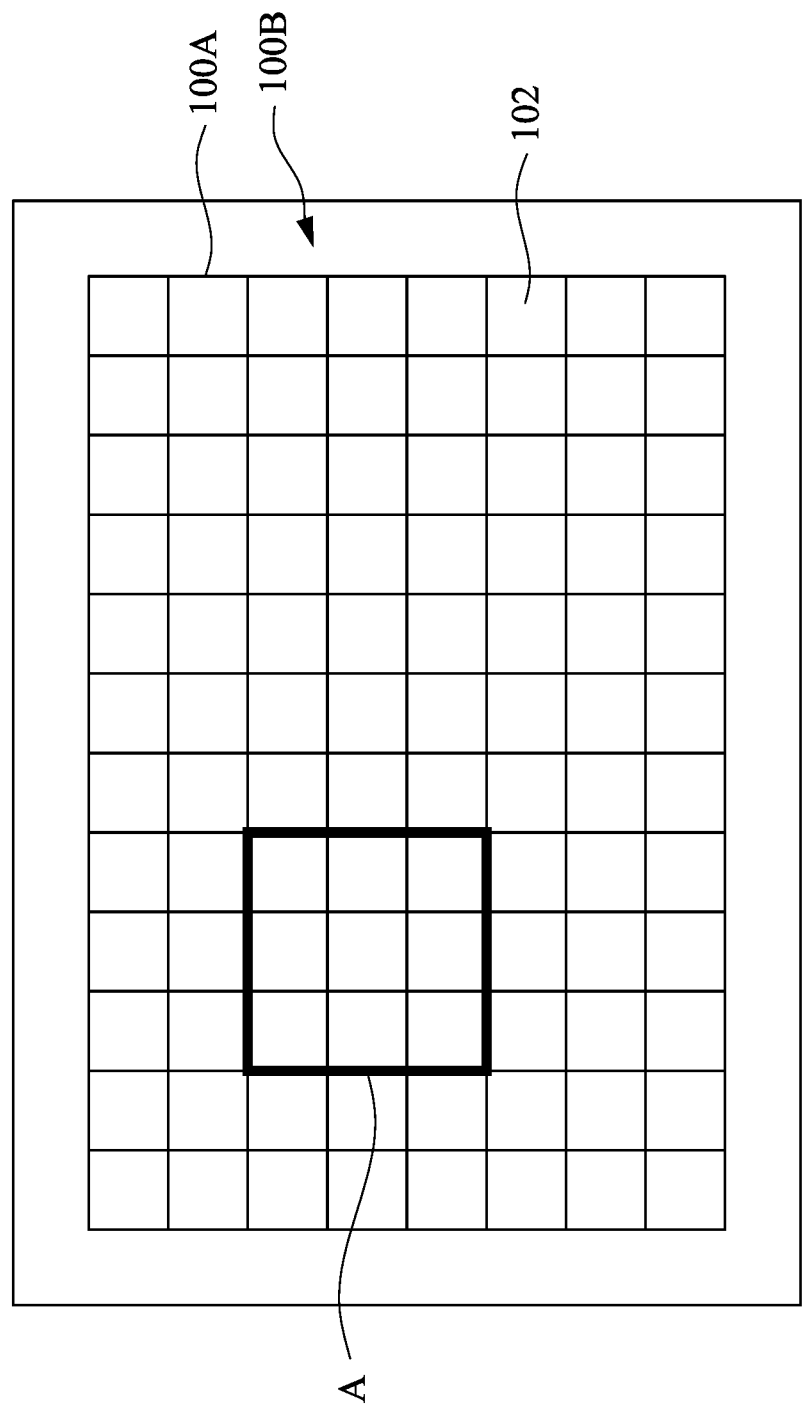
FIG. 1A is a schematic top view of an image sensor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Further, spatially relative terms, such as "over," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to an image sensor device with improved infrared radiation (such as near infrared radiation) absorption ability. Typically, a semiconductor material with a direct band gap may absorb more incident light or incident radiation with low photon energy than another semiconductor material with an indirect band gap. In the image sensor device, radiation sensing members are formed from a semiconductor material with a direct band gap and low optical band gap energy. In a case in which a germanium member in a silicon substrate for absorbing incident light, an indirect band gap of the germanium member is transformed to a direct band gap under a biaxial tensile stress induced by an annealing process. As such, the infrared radiation absorption efficiency is enhanced.

FIG. 1A is a schematic top view of an image sensor device 100 in accordance with some embodiments of the present disclosure. The image sensor device 100 is a back-side illuminated (BSI) or front-side illuminated (FSI) complementary metal oxide semiconductor (CMOS) image sensor. The image sensor device 100 has a pixel region 100A and a logic region 100B surrounding the pixel region 100A. The pixel region 100A includes pixel units 102 for generating electric charges responsive to light incident thereon. In some embodiments, as shown in FIG. 1A, the pixel units 102 are arranged into a matrix of columns and rows. Some circuits are located in the pixel region 100A for transferring electric charges generated from the pixel units 102 to the logic region 100B. Other circuits are located in the logic region 100B for processing output signals from the pixel region 100A. In the present disclosure, the number of the pixel units 102 may be one million, for example. However, the number of the pixel units 102 in the image sensor device 100 may vary in accordance with various applications.

Figure 1B:
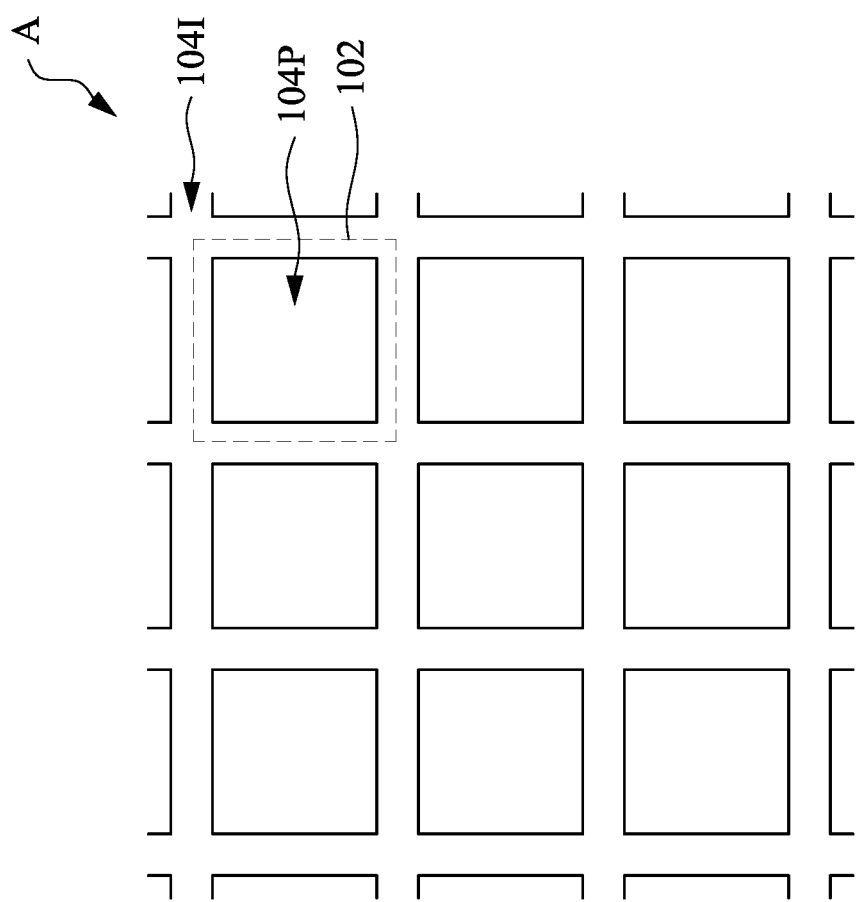
FIG. 1B is an enlarged partial view of the image sensor device of FIG. 1A.

Also referring to FIG. 1B, FIG. 1B is an enlarged view of an area A of the pixel region 100A shown in FIG. 1A. As shown in FIG. 1B, there are photosensitive regions 104P and an isolation region 104I in the area A of the pixel region 100A. The photosensitive regions 104P are configured to detect incident light. The isolation region 104I is arranged in a grid pattern, and is configured to isolate the photosensitive regions 104P from crosstalk. Each of the photosensitive regions 104P and a portion of the isolation region 104I surrounding the corresponding photosensitive region 104P constitutes one of the pixel units 102.

Figure 2:
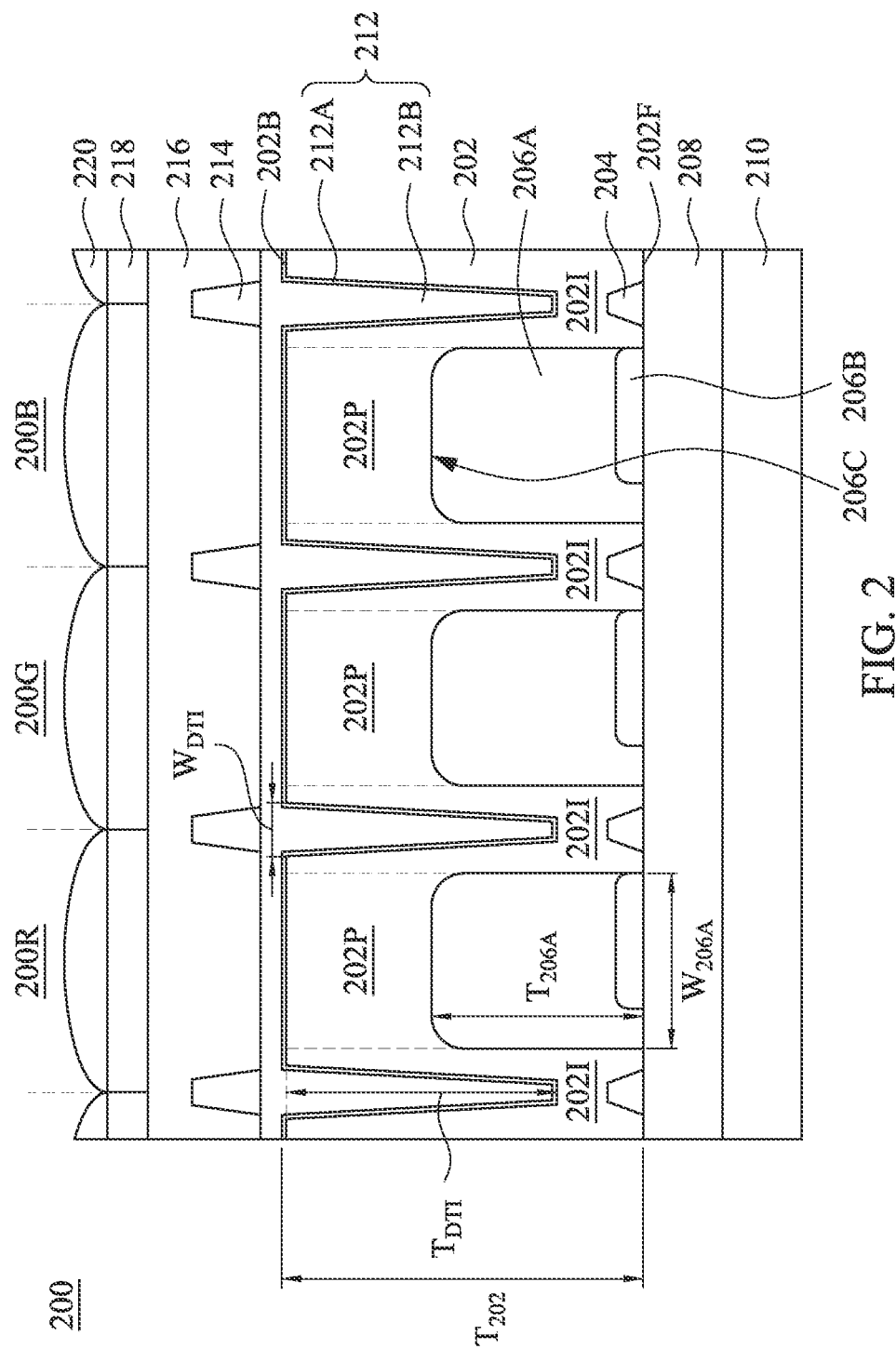
FIG. 2 is a schematic cross-sectional view of a portion of an image sensor device in accordance with some embodiments of the present disclosure.

FIG. 2 is a cross-sectional view of an image sensor device 200 in accordance with some embodiments of the present disclosure. The image sensor device 200 may be the image sensor device 100 of FIG. 1A or another similar image sensor device. The image sensor device 200 may be a BSI CMOS image sensor in which metal wirings are disposed in a front side of a substrate, and radiation sensing members are disposed on a back side of a substrate. However, embodiments of the present disclosure are not limited to being the BSI CMOS image sensor. For example, the image sensor device 200 may be an FSI CMOS image sensor in which metal wirings are disposed over radiation sensing members that is disposed in a surface of a substrate. For simplicity, FIG. 2 only illustrates three pixel regions 200R, 200G and 200B of the image sensor device 200, but embodiments of the present disclosure are not limited thereto. In some embodiments, the pixel regions 200R, 200G and 200B are red, green and blue pixel regions, respectively. Other combinations of the pixel regions 200R, 200G and 200B may be applied for various embodiments.

In FIG. 2, a semiconductor substrate 202 of the image sensor device 200 includes photosensitive regions 202P for detecting incident light and an isolation region 202I for isolating the photosensitive regions 202P from crosstalk. In the embodiments where the image sensor device 200 is the image sensor device 100 of FIG. 1A, the photosensitive regions 202P correspond to the photosensitive regions 104P, while the isolation region 202I corresponds to the isolation region 104I. The semiconductor substrate 202 may be a silicon substrate, for example. In some exemplary examples, the semiconductor substrate 202 includes bulk silicon that may be undoped or doped (e.g., p-type, n-type, or a combination thereof). Other materials that are suitable for the formation of the image sensor device 200 may be used. For example, the semiconductor substrate 202 may include a material such as germanium, quartz, sapphire, glass and/or another suitable material. Alternatively, the semiconductor substrate 202 may be an active layer of a semiconductor-on-insulator (SOI) substrate. In some embodiments, the semiconductor substrate 202 has a thickness $T_{202}$ ranging from about 1.5 μm to about 8 μm. In certain embodiments, the thickness $T_{202}$ of the semiconductor substrate 202 is about 6 μm.

A shallow trench isolation (STI) 204 is disposed in the isolation region 202I of the semiconductor substrate 202 and at a front side surface 202F of the semiconductor substrate 202. The STI 204 includes an isolation material, such silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material. In some embodiments, the STI 204 is disposed in a grid pattern.

Radiation sensing members 206A are disposed in the photosensitive regions 202P of the semiconductor substrate 202, respectively, and are at the front side surface 202F of the semiconductor substrate 202. The radiation sensing members 206A include a semiconductor material of which an optical band gap energy is smaller than 1.77 eV. In some embodiments, the semiconductor material of the radiation sensing members 206A has an optical band gap smaller than 1.1 eV. The radiation sensing members 206A may include, for example, germanium, silicon germanium, gallium arsenide, indium phosphide, gallium antimonide, cadmium telluride, indium arsenide, indium antimonide, combinations thereof, and/or another suitable material. As shown in FIG. 2, each of the radiation sensing members 206A extends from the front side surface 202F of the semiconductor substrate 202. Each of the radiation sensing members 206A may include a thickness $T_{206A}$ ranging from about 100 nm to about 8 μm and a width $W_{206A}$ ranging from about 0.9 μm to about 3 μm. The thickness $T_{206A}$ of each of the radiation sensing members 206A is less than or equal to the thickness $T_{202}$ of the semiconductor substrate 202. In certain embodiments, the thickness $T_{206A}$ of each of the radiation sensing members 206A ranges from about 1.5 to about 3 μm. In some embodiments, the radiation sensing members 206A may be formed with different thicknesses $T_{206A}$ and/or widths $W_{206A}$ in accordance with various design requirements.

In the embodiments where the semiconductor substrate 202 is a silicon substrate and the semiconductor material of the radiation sensing members 206A is germanium, an annealing process may be applied to form silicon-germanium bonds at the interfaces 206C between the semiconductor substrate 202 and the radiation sensing members 206A. As such, a strained silicon-germanium heteroepitaxial layer is formed on the semiconductor substrate 202 of silicon, and thus the indirect band gap of germanium transfers to a direct band gap of silicon-germanium, and smaller optical band gap energy is achieved, as well as better infrared radiation absorption ability. In some embodiments, the annealing process may be a high-temperature in-situ annealing process at about 500° C. to about 600° C., in order to reduce threading dislocations between the semiconductor substrate 202 and the radiation sensing members 206A, and the duration of the annealing process may be about or less than 10 hours.

As shown in FIG. 2, a portion of each of the radiation sensing members 206A is a pinned element 206B, such as a P-type pinned photodiode. For exemplary examples, the pinned elements 206B include a p-type dopant such as boron, aluminum, gallium, a combination thereof, or the like. The pinned elements 206B are used for interface isolation between the radiation sensing members 206A and the device layer 208.

A device layer 208 is disposed over the front side surface 202F of the semiconductor substrate 202, the STI 204 and the radiation sensing members 206A. The device layer 208 may include various transistors electrically connected with the radiation sensing members 206A to collect electrons generated by incident light and/or incident radiation (e.g. visible light and/or infrared radiation) traveling to the photosensitive regions 202P of the semiconductor substrate 202 and to convert the collected electrons into voltage signals. For example, the transistors in the device layer 208 may include a combination of transfer transistors, reset transistors, source follower transistors, row select transistors, and/or other suitable transistors. For the sake of simplicity, detailed structures of the transistors and the other components (e.g. contact plugs, vias, conductive lines, etc.) in the device layer 208 are not shown in FIG. 2.

The device layer 208 may also include an inter-layer dielectric (ILD) layer (not shown) and an inter-metal dielectric (IMD) layer (not shown) over the ILD layer (not shown), in accordance with some embodiments. The ILD layer (not shown) may include a material of phosphosilicate glass (PSG), borosilicate glass (BSG), boron-doped phosphosilicate glass (BPSG), tetraethyl-orthosilicate (TEOS) oxide, or the like. In addition, the ILD layer (not shown) may include contact plugs configured to electrically connect the transistors in the device layer 208. The IMD layer (not shown) may include vias and conductive lines; each of the vias may be electrically connected between the conductive lines, and the conductive lines may be electrically connected to the transistors in the device layer 208 to transfer the voltage signals.

In addition, in some embodiments, a carrier substrate 210 may be bonded to the device layer 208. In some embodiments, the carrier substrate 210 may be bonded to the device layer 208 by a molecular force bonding process, such as a direct bonding process and an optical fusion bonding process, or another suitable bonding process known in the art.

A deep trench isolation (DTI) 212 is disposed in the isolation region 202I of the semiconductor substrate 202, in order to prevent incident light from penetrating therethrough. The DTI 212 includes an isolation material, such as hafnium oxide, tantalum oxide, zirconium oxide, titanium oxide, aluminum oxide, high-k dielectrics, combinations thereof, and/or another suitable material. As shown in FIG. 2, the DTI 212 extends from the back side surface 202B of the semiconductor substrate 202. The top surface of the DTI 212 may be over the semiconductor substrate 202 or be coplanar to the back side surface 202B of the semiconductor substrate 202. The DTI 212 may include a thickness $T_{DTI}$ (i.e. from the back side surface 202B of the semiconductor substrate 202 to the bottom surface of the DTI 212) and a width $W_{DTI}$, and the ratio of the thickness $T_{DTI}$ to the width $W_{DTI}$ may be equal to or greater than 5, so as to provide good isolation performance. In some embodiments, the ratio of the thickness $T_{DTI}$ to the width $W_{DTI}$ ranges from about 5 to about 15. In certain embodiments, the width $W_{DTI}$ ranges from about 0.1 μm to about 0.5 μm, and the thickness $T_{DTI}$ ranges from about 1.5 μm to about 4 μm.

In some embodiments, the DTI 212 includes multiple layers. For example, as illustrated in FIG. 2, a first layer 212A and a second layer 212B of different isolation materials may be sequentially disposed over the back side surface 202B of the semiconductor substrate 202. The first layer 212A may be a film disposed conformal to the trench in the isolation region 202I of the semiconductor substrate 202 and the back side surface 202B of the semiconductor substrate 202. The second layer 212B is disposed over the first layer 212A and filling the trench. The first layer 212A includes a high-k dielectric material, such as hafnium oxide, tantalum oxide, zirconium oxide, titanium oxide, aluminum oxide, combinations thereof, and/or the like. The second layer 212B may include a dielectric material, for example, silicon oxide, silicon nitride, silicon oxynitride, silicon carbide, combinations thereof, and/or the like.

A metal grid 214 is disposed over the back side surface 202B of the semiconductor substrate 202. As shown in FIG. 2, the metal grid 214 is formed in the isolation region 202I of the semiconductor substrate 202 and on the DTI 212. Particularly, in some embodiments, the metal grid 214 is aligned with DTI 212. In some embodiments, the metal grid 214 is disposed covering the DTI 212. The metal grid 214 may include a metal material, such as aluminum, copper, tungsten, tantalum, titanium, combinations thereof, and/or the like. Each portion of the metal grid 214 may have a cross-sectional shape of rectangle, trapezoid, reverse trapezoid, triangle, or another suitable shape. In some embodiments, the metal grid 214 has a thickness $T_{214}$ ranging from about 10 nm to about 0.1 μm.

A dielectric layer 216 is disposed over the metal grid 214 and the back side surface 202B of the semiconductor substrate 202. The dielectric layer 216 may include silicon oxide, silicon nitride, silicon oxynitride, low-k dielectric, spin on glass (SOG), and/or another suitable dielectric material. The dielectric layer 216 has a thickness $T_{216}$ equal to or greater than the thickness $T_{214}$ of the metal grid 214. In certain embodiments, the dielectric layer 216 may have multiple dielectric layers.

A color filter layer 218 is disposed over the dielectric layer 216. The color filter layer 218 may allow light components in a particular wavelength band to penetrate therethrough and block unwanted light components. The passing wavelength band of the color filter layer 218 may be a red light wavelength band, a green light wavelength band a blue light wavelength band, or combinations thereof, but is not limited thereto. Infrared light may pass through the color filter layer 218 and be absorbed in the semiconductor substrate 202. The color filter layer 218 may include a material of, for example, pigment-based polymer, dye-based polymer, resin and another suitable material.

A microlens layer 220 is disposed over the color filter layer 218. The microlens layer 220 has convex shapes respectively in the pixel regions 200R, 200G and 200B for improving light receiving efficiency. The microlens layer 220 may be formed from glass, acrylic polymer or another suitable material with high transmittance.

Figure 3A:
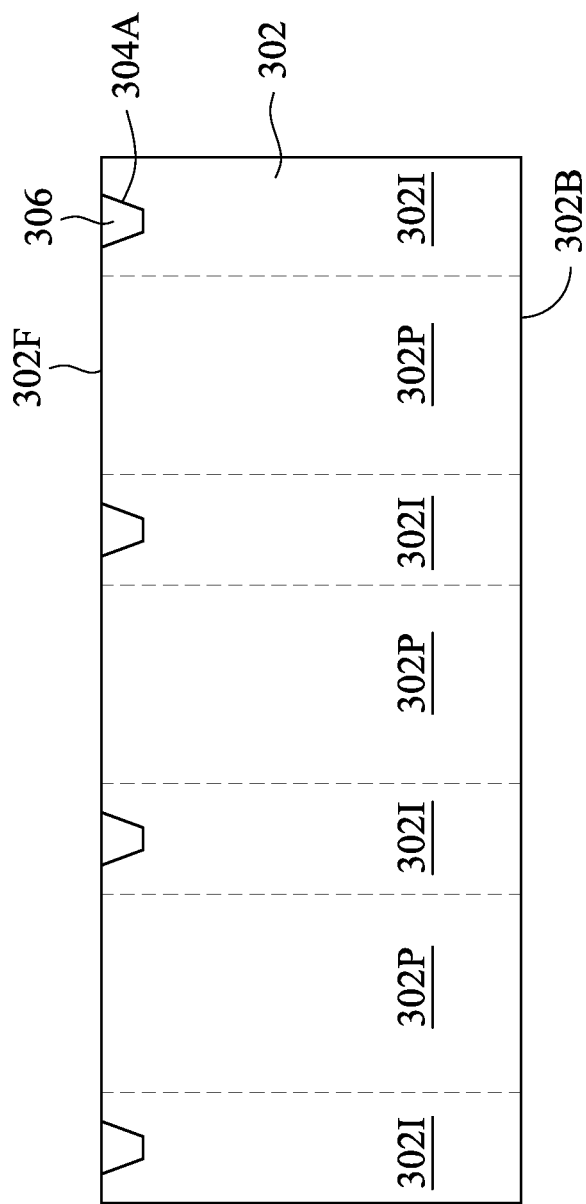
FIG. 3A to FIG. 3J are schematic cross-sectional views of intermediate stages in the formation of an image sensor device in accordance with some embodiments of the present disclosure.

FIG. 3A to FIG. 3J are cross-sectional views of various intermediary steps of forming an image sensor device in accordance with some embodiments of the present disclosure. As shown in FIG. 3A, a semiconductor substrate 302 is provided. The semiconductor substrate 302 may be formed from a semiconductor material of silicon, for example. In some exemplary examples, the semiconductor substrate 302 includes bulk silicon that may be undoped or doped (e.g., p-type, n-type, or a combination thereof). Other materials that are suitable for the formation of the image sensor device may be used. For example, the semiconductor substrate 302 may be formed from a material such as germanium, quartz, sapphire, glass and/or another suitable material. Alternatively, the semiconductor substrate 302 may be formed as an active layer of an SOI substrate.

In addition, as shown in FIG. 3A, the semiconductor substrate 302 includes photosensitive regions 302P for detecting incident light and an isolation region 302I for isolating the photosensitive regions 302P from crosstalk. An STI 306 is formed in the isolation regions 302I of the semiconductor substrate 302. In detail, an etching process is performed on the front side surface 302F of the semiconductor substrate 302 to form a shallow trench 304A, and then a deposition process is performed to fill an isolation material into the shallow trench 304A to form the STI 306. In the etching process of forming the shallow trench 304A, a patterned photoresist (not shown) is used as a mask to cover the photosensitive regions 302P of the semiconductor substrate 302, so as to form the shallow trench 304A in the isolation region 302I of the semiconductor substrate 302. The etching process of forming the shallow trench 304A may be, for example, a reactive ion etching process, a plasma etching process, a dry etching process, a wet etching process, and/or another suitable etching process. After the etching process of forming the shallow trench 304A, the patterned photoresist (not shown) is stripped. Then, an isolation material is filled in the shallow trench 304A, so as to form the STI 306 in the isolation region 302I of the semiconductor substrate 302. The isolation material used to form the STI 306 may be, for example, silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material. In some embodiments, the isolation material is filled on by utilizing a process, such as a chemical vapor deposition (CVD) process, a SACVD process, a high density plasma CVD (HDPCVD) process, a high aspect ratio process (HARP), a spin-on coating process, a sputtering process, and/or another suitable process, combinations thereof, and/or another suitable process. In some embodiments, a chemical mechanical polishing (CMP) process may be performed to planarize the STI 306, such that the top surface of the STI 306 is coplanar with the front side surface 302F of the semiconductor substrate 302.

Figure 3B:
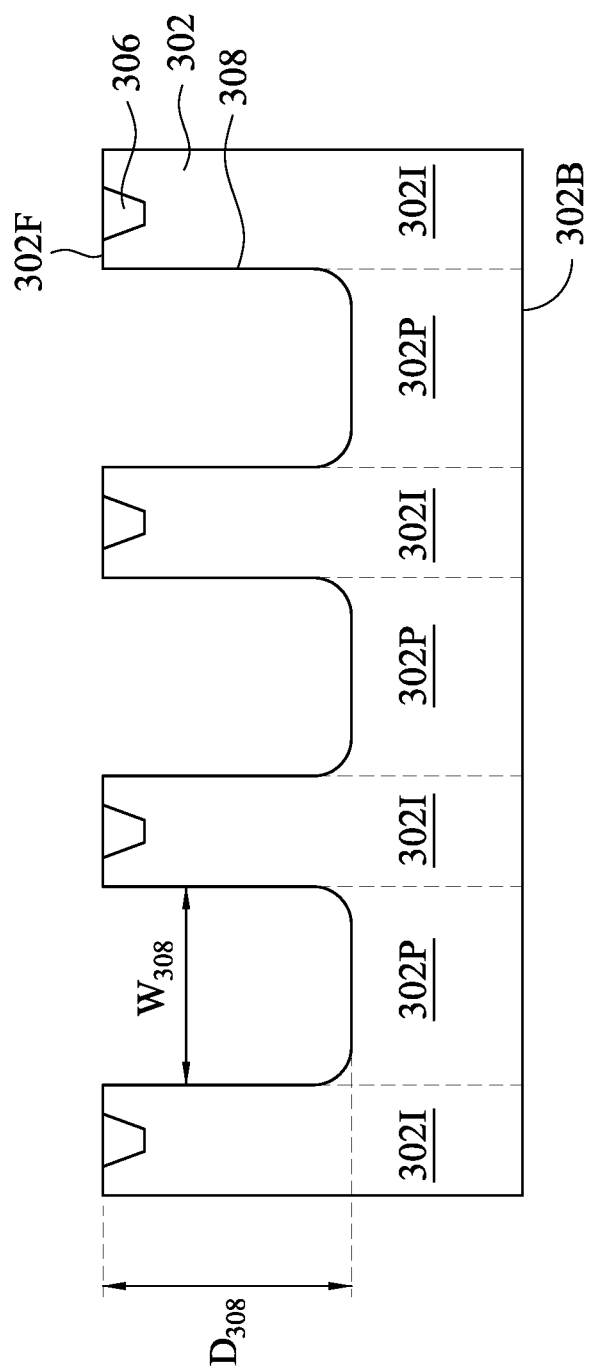

Then, as shown in FIG. 3B, an etching process is performed on the semiconductor substrate 302 to form recesses 308 respectively in the photosensitive regions 302P of the semiconductor substrate 302. In the etching process of forming the recesses 308, a patterned photoresist (not shown) is used as a mask to cover the isolation region 302I of the semiconductor substrate 302, so as to form the recesses 308 respectively in the photosensitive regions 302P of the semiconductor substrate 302. The etching process of forming the shallow trench 304A may be an anisotropic etching process and/or an isotropic etching process, such as a reactive ion etching process, a plasma etching process, a dry etching process, a wet etching process, and/or another suitable etching process. After the etching process of forming the recesses 308, the patterned photoresist (not shown) is stripped. Each of the recesses 308 may be formed with a depth $D_{308}$ ranging from about 100 nm to about 8 μm and a width $W_{308}$ ranging from about 0.9 μm to about 3 μm. In certain embodiments, the depth $D_{308}$ of each of the recesses 308 ranges from about 1.5 to about 3 In some embodiments, the recesses 308 may be formed with different depths $D_{308}$ and/or widths $W_{308}$.

Figure 3C:
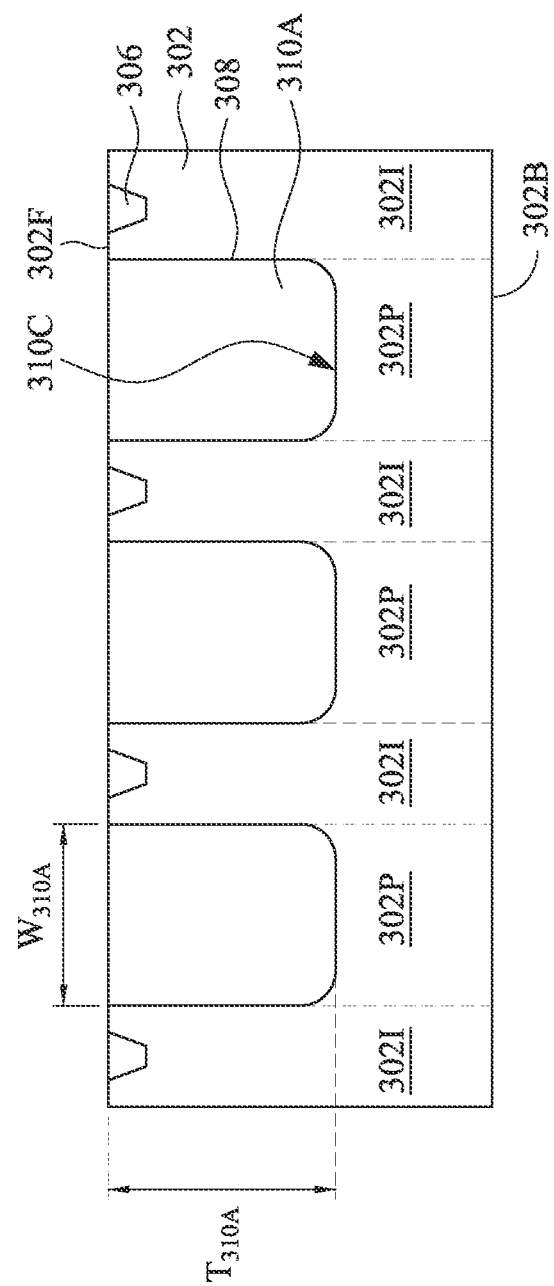

Afterwards, as shown in FIG. 3C, a deposition process is performed to fill a semiconductor material into the recesses 308 to form radiation sensing members 310A respectively in the photosensitive regions 302P of the semiconductor substrate 302. The semiconductor material used to form the radiation sensing members 310A has an optical band gap smaller than 1.77 eV. In certain embodiments, the optical band gap energy of the semiconductor material used to form the radiation sensing members 310A is smaller than 1.1 eV. The radiation sensing members 310A may be formed from, for example, germanium, silicon germanium, gallium arsenide, indium phosphide, gallium antimonide, cadmium telluride, indium arsenide, indium antimonide, combinations thereof, and/or another suitable material. In some embodiments, the semiconductor material is filled on by utilizing a process, such as an HDPCVD process, an HARP, a CVD process, a plasma enhanced CVD (PECVD) process, an SACVD process, a spin-on coating process, a sputtering process, and/or another suitable process, combinations thereof, and/or another suitable process. In some embodiments, a CMP process may be further performed to planarize the radiation sensing members 310A, such that the top surface of each of the radiation sensing members 310A is coplanar with the front side surface 302F of the semiconductor substrate 302, and therefore a thickness $T_{310A}$ and a width $W_{310A}$ of the radiation sensing members 310A correspond to depth $D_{308}$ and the width $W_{308}$ of the recesses 308, respectively.

In the embodiments where the semiconductor substrate 302 is formed from silicon and the radiation sensing members 310A are formed from germanium, an annealing process may then be performed on the radiation sensing members 310A to form silicon-germanium bonds at the interfaces 310C between the semiconductor substrate 302 and the radiation sensing members 310A. As such, a strained silicon-germanium heteroepitaxial layer is formed on the semiconductor substrate 302 of silicon, and thus the indirect band gap of germanium transfers to a direct band gap of silicon-germanium, and smaller optical band gap energy is achieved, as well as better infrared radiation absorption ability. In some embodiments, the annealing process may be a high-temperature in-situ annealing process at about 500° C. to about 600° C., in order to reduce threading dislocations between the semiconductor substrate 302 and the radiation sensing members 310A, and the duration of the annealing process may be about or less than 10 hours.

In the embodiments where the material of the radiation sensing members 310A is silicon germanium, the radiation sensing members 310A may be formed by a PECVD process. The percentages of silicon and germanium (i.e. the Ge fraction x of $Si_{1-x}Ge_x$) in the radiation sensing members 310A may be controlled by adjusting the amount of $SiH_4$ and $GeH_4$ that are used to form silicon germanium.

Figure 3D:
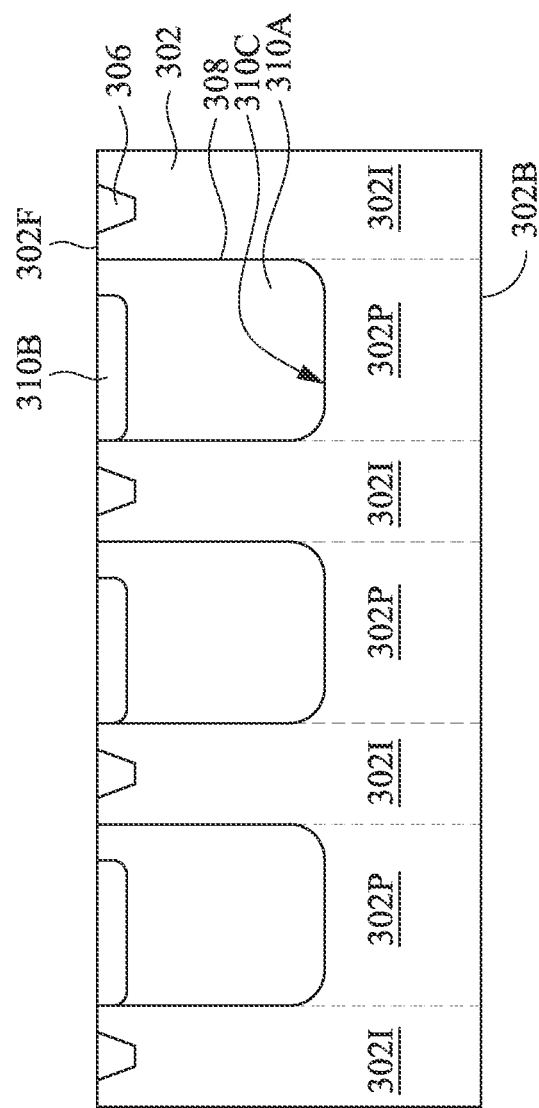

Then, as shown in FIG. 3D, a portion of each of the radiation sensing members 310A is implanted by an ion implantation process to form pinned elements 310B. For exemplary examples, each of the pinned elements 310B is a P-type pinned photodiode which may be formed including a p-type dopant such as boron, aluminum, gallium, a combination thereof, or the like. The pinned elements 310B are used for interface isolation between the radiation sensing members 310A and the device layer 312 that will be formed later.

Figure 3E:
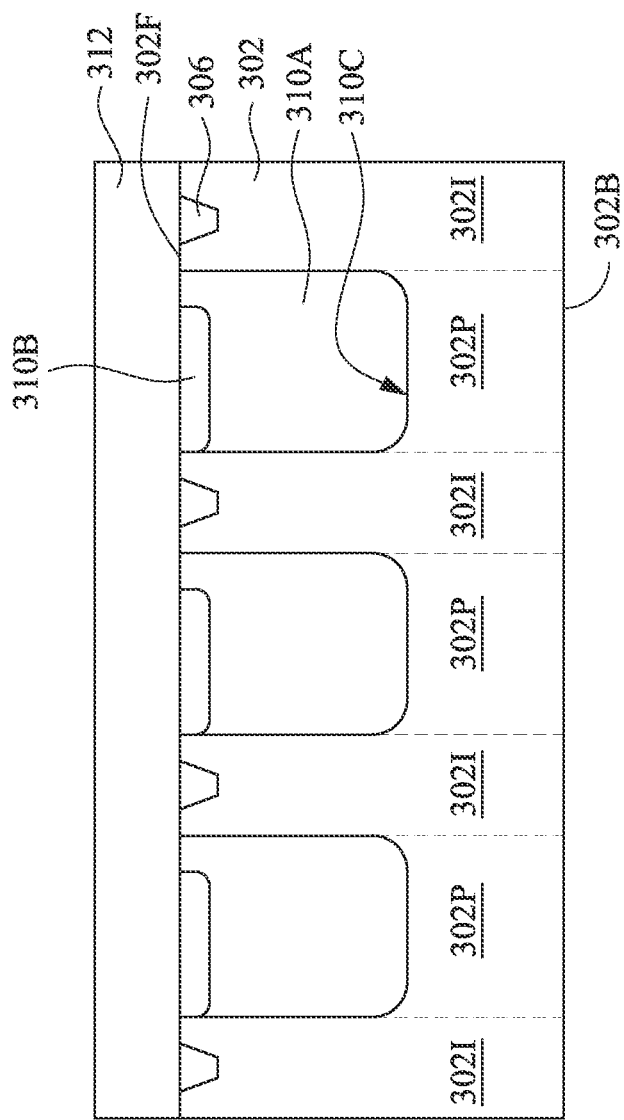

Then, as shown in FIG. 3E, a device layer 312 is formed over the front side surface 302F of the semiconductor substrate 302, the STI 306, the radiation sensing members 310A and the pinned elements 310B. The device layer 312 may be formed including various transistors electrically connected with the radiation sensing members 310A to collect electrons generated by incident light and/or incident radiation (e.g. visible light and/or infrared radiation) traveling to the photosensitive regions 302P of the semiconductor substrate 302 and to convert the collected electrons into voltage signals. For example, the transistors in the device layer 312 may include a combination of transfer transistors, reset transistors, source follower transistors, row select transistors, and/or other suitable transistors. For the sake of simplicity, detailed structures of the transistors and the other components in the device layer 312 are not shown in FIG. 3E to FIG. 3J.

The device layer 312 may be formed also including an ILD layer (not shown) and an IMD layer (not shown) over the ILD layer (not shown), in accordance with some embodiments. The ILD layer (not shown) may be formed from PSG, BSG, BPSG, TEOS oxide, or the like. In addition, contact plugs may be formed in the ILD layer (not shown) for electrically connecting the transistors in the device layer 312. The IMD layer (not shown) may include vias and conductive lines; each of the vias may be electrically connected between the conductive lines, and the conductive lines may be electrically connected to the transistors in the device layer 312 to transfer the voltage signals.

Figure 3F:
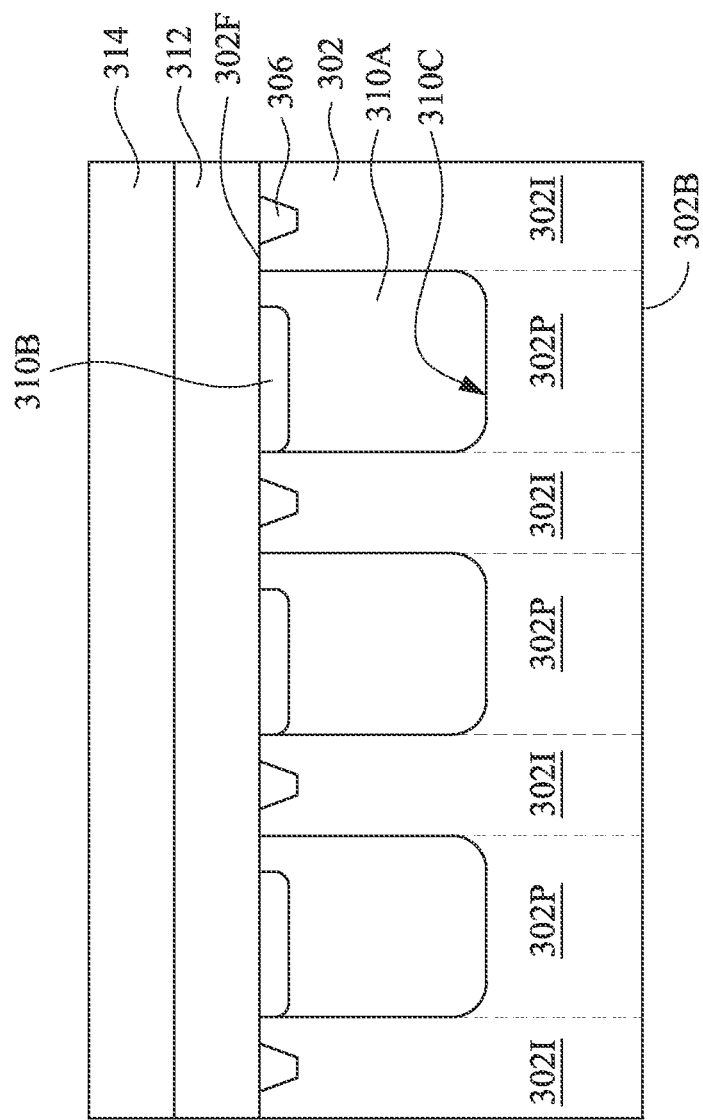

Afterwards, as shown in FIG. 3F, a carrier substrate 314 is bonded to the device layer 312 by a bonding process, in accordance with some embodiments. In some embodiments, the bonding process may include a molecular force bonding process, such as a direct bonding process and an optical fusion bonding process. In another embodiment, the bonding process may include another suitable bonding process known in the art.

Figure 3G:
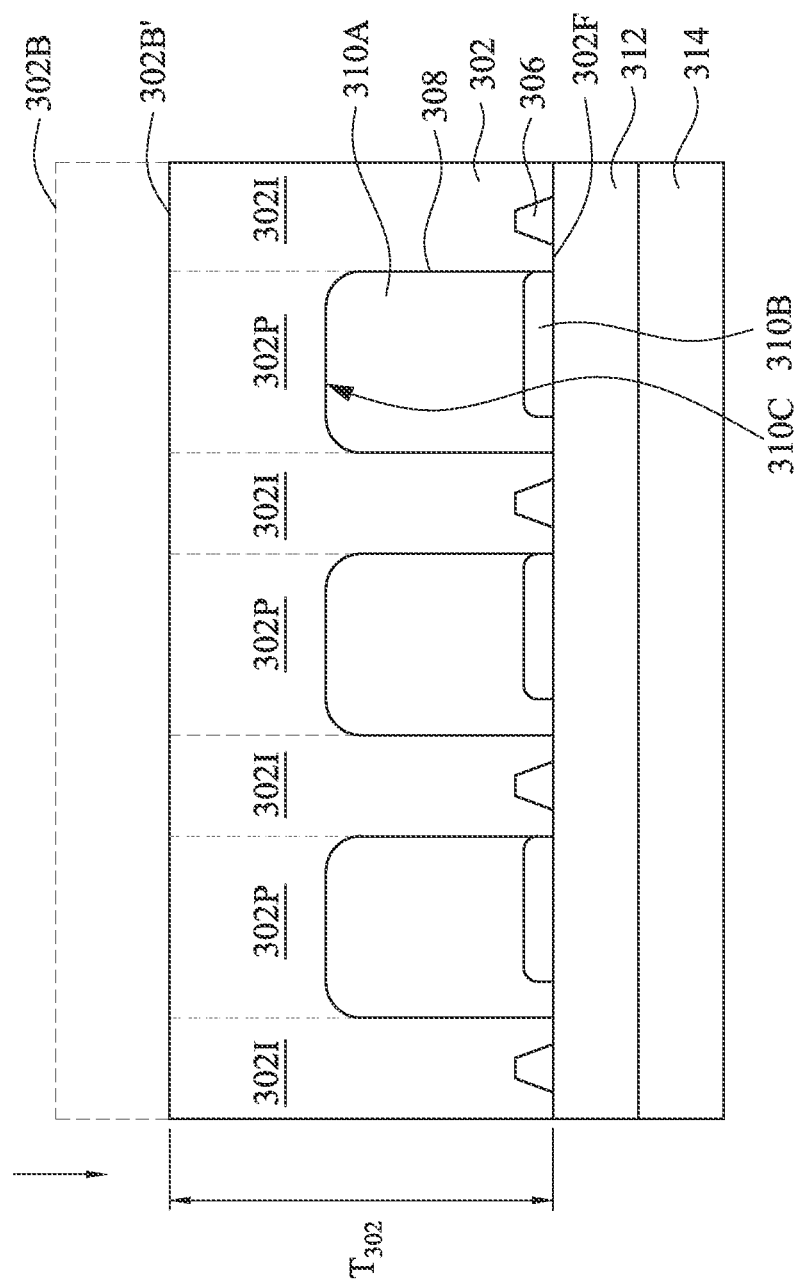

Then, as shown in FIG. 3G, a thinning process is performed on the back side surface 302B of the semiconductor substrate 302 to reduce the thickness of the semiconductor substrate 302. The thickness $T_{302}$ (i.e. the distance between the front side surface 302F and the new back side surface 302B' of the thinned semiconductor substrate 302) of the semiconductor substrate 302 is equal to or greater than the thickness $T_{310A}$ of each of the radiation sensing members 310A. In some embodiments, the thickness $T_{302}$ of the semiconductor substrate 302 ranges from about 1.5 μm to about 8 μm. In certain embodiments, the thickness $T_{302}$ of the semiconductor substrate 302 is about 6 μm. The thinning process to the semiconductor substrate 302 may include an etching process, a CMP process and/or another suitable process.

Figure 3H:
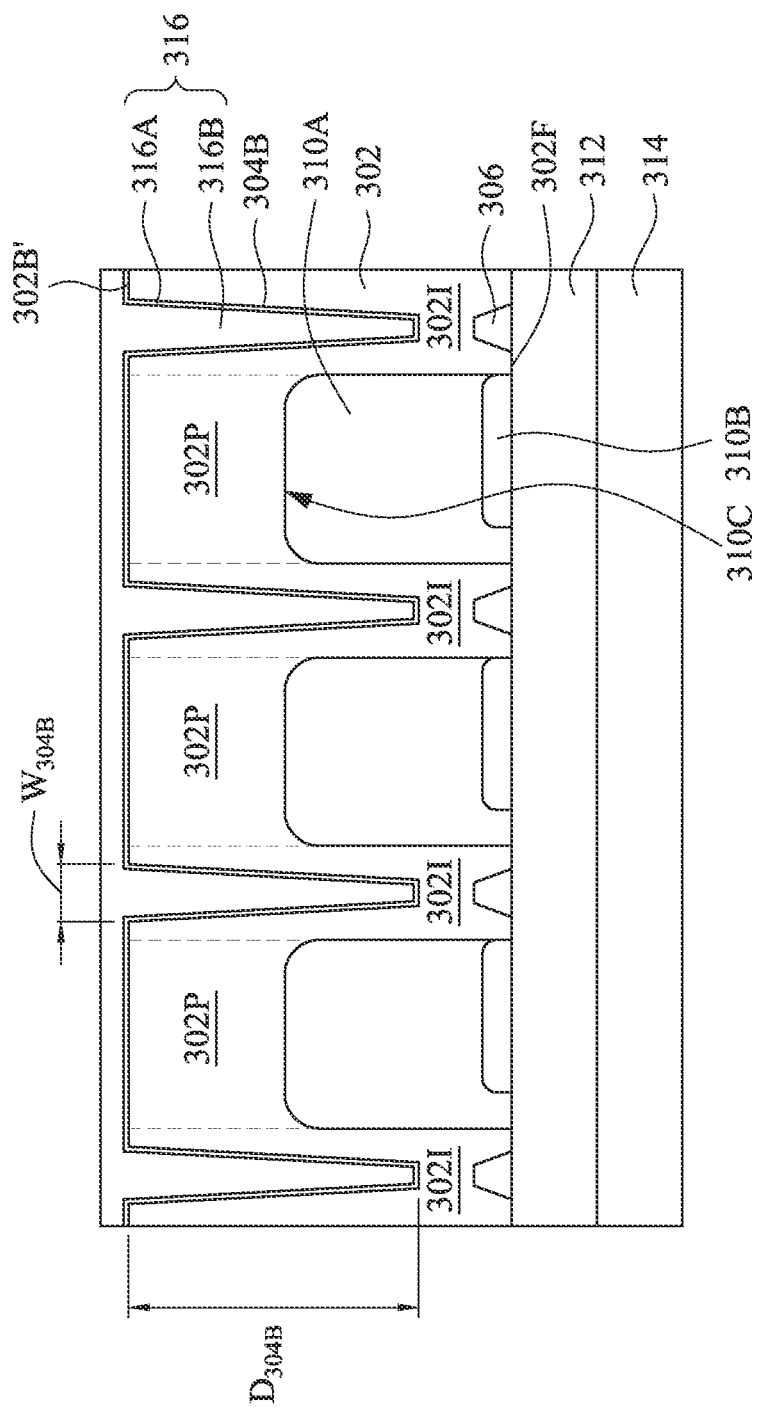

Afterwards, as shown in FIG. 3H, a DTI 316 is formed in the isolation region 302I of the semiconductor substrate 302, in order to prevent incident light from penetrating therethrough. In detail, an etching process is performed on the back side surface 302B' of the semiconductor substrate 302 to form a deep trench 304B, and then a deposition process is performed to fill an isolation material into the deep trench 304B to form the DTI 316. In the etching process of forming the deep trench 304B, a patterned photoresist (not shown) is used as a mask to cover the photosensitive regions 302P of the semiconductor substrate 302, so as to form the deep trench 304B in the isolation region 302I of the semiconductor substrate 302. The etching process of forming the deep trench 304B may be, for example, a reactive ion etching process, a plasma etching process, a dry etching process, a wet etching process, and/or another suitable etching process. The deep trench 304B is formed having a depth $D_{304B}$ and a width $W_{304B}$, and the ratio of the depth $D_{304B}$ to the width $W_{304B}$ may be equal to or greater than 5, so as to provide good isolation performance. In some embodiments, the ratio of the depth $D_{304B}$ to the width $W_{304B}$ ranges from about 5 to about 15. In certain embodiments, the width $W_{304B}$ ranges from about 0.1 μm to about 0.5 μm, and the depth $D_{304B}$ ranges from about 1.5 μm to about 4 μm. After the etching process of forming the deep trench 304B, the patterned photoresist (not shown) is stripped.

Subsequently, an isolation material is filled in the deep trench 304B, so as to form the DTI 316 in the isolation region 302I of the semiconductor substrate 302. The isolation material used to form the DTI 316 may be, for example, hafnium oxide, tantalum oxide, zirconium oxide, titanium oxide, aluminum oxide, high-k dielectrics, combinations thereof, and/or another suitable material. In some embodiments, the isolation material is filled on by utilizing a process, such as an HDPCVD process, an HARP, a CVD process, a SACVD process, a spin-on coating process, a sputtering process, and/or another suitable process, combinations thereof, and/or another suitable process. In some embodiments, a CMP process may be performed to planarize the top surface of the DTI 316. The top surface of the DTI 316 may be over the semiconductor substrate 302 or be coplanar with the back side surface 302B' of the semiconductor substrate 302.

In some embodiments, the DTI 316 is formed including multiple layers. For example, as illustrated in FIG. 3H, a first layer 316A and a second layer 316B of different isolation materials may be sequentially formed over the back side surface 302B' of the semiconductor substrate 302. The first layer 316A may be a film formed conformal to the deep trench 304B and the back side surface 302B' of the semiconductor substrate 302. The second layer 316B is formed over the first layer 316A and filling the deep trench 304B. The first layer 316A may be formed from a high-k dielectric material, such as hafnium oxide, tantalum oxide, zirconium oxide, titanium oxide, aluminum oxide, combinations thereof, and/or the like. The second layer 316B may be formed from, for example, silicon oxide, silicon nitride, silicon oxynitride, silicon carbide, combinations thereof, and/or the like. Each of the first layer 316A and the second layer 316B may be formed by utilizing a process, such as an HDPCVD process, an HARP, a CVD process, a SACVD process, a spin-on coating process, a sputtering process, combinations thereof, and/or another suitable process.

Figure 3I:
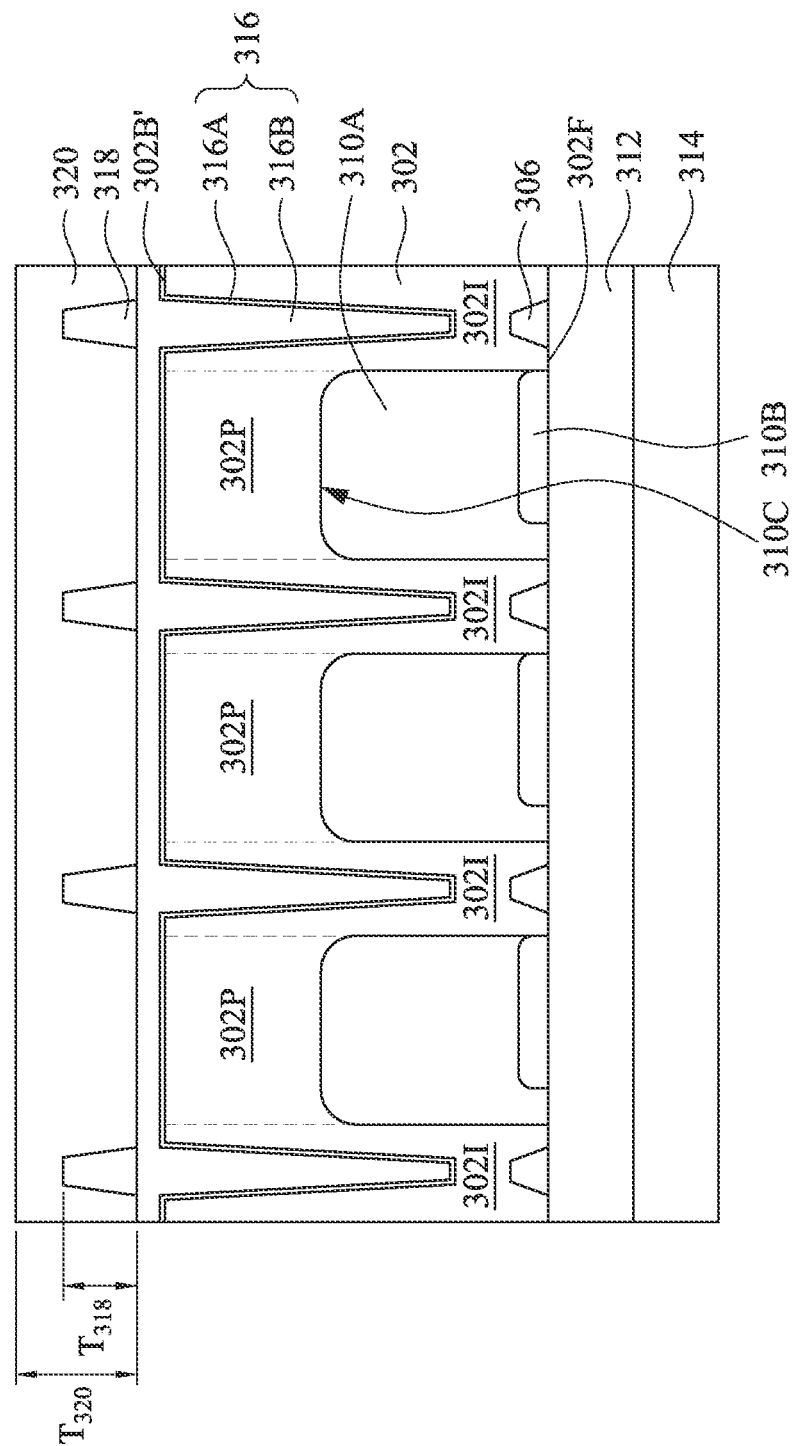

Then, as shown in FIG. 3I, a metal grid 318 is formed over the back side surface 302B' of the semiconductor substrate 302, and then a dielectric layer 320 is formed over the metal grid 318 and the back side surface 302B' of the semiconductor substrate 302.

In detail, as shown in FIG. 3I, the metal grid 318 is formed in the isolation region 302I of the semiconductor substrate 302 and on the DTI 316. Particularly, in some embodiments, the metal grid 318 is aligned with DTI 316. In some embodiments, the metal grid 318 is formed covering the DTI 316. The metal grid 318 may be formed from a metal material, such as aluminum, copper, tungsten, tantalum, titanium, combinations thereof, and/or the like. The metal grid 318 is formed by performing a deposition process and a patterning process. The deposition process may include a physical vapor deposition (PVD) process, a CVD process, a low pressure CVD (LPCVD) process, a PECVD process, an HDPCVD process, an atomic layer deposition (ALD) process, a spin-on coating process, an electroplating process, a sputtering process, and/or another suitable process. The patterning process may include a photolithography process and an etching process, such as a reactive ion etching (RIE) process or another suitable process. Each portion of the metal grid 318 has a cross-sectional shape of rectangle, trapezoid, reverse trapezoid, triangle, or another suitable shape. The metal grid 318 may be formed having a thickness $T_{318}$ ranging from about 10 nm to about 0.1 μm.

The dielectric layer 320 is formed covering the metal grid 318. The dielectric layer 320 may be formed from silicon oxide, silicon nitride, silicon oxynitride, low-k dielectric, SOG, and/or another suitable dielectric material. The dielectric layer 320 may be formed by a deposition process such as a PVD process, a CVD process, an LPCVD process, a PECVD process, an HDPCVD process, an ALD process, a spin-on coating process, a sputtering process, and/or another suitable process. A further planarization process, such as a CMP process, may be performed on the dielectric layer 320 to planarize the dielectric layer 320. The dielectric layer 320 is formed having a thickness $T_{320}$ equal to or greater than the thickness $T_{318}$ of the metal grid 318. In certain embodiments, the dielectric layer 320 may be formed having multiple dielectric layers.

Figure 3J:
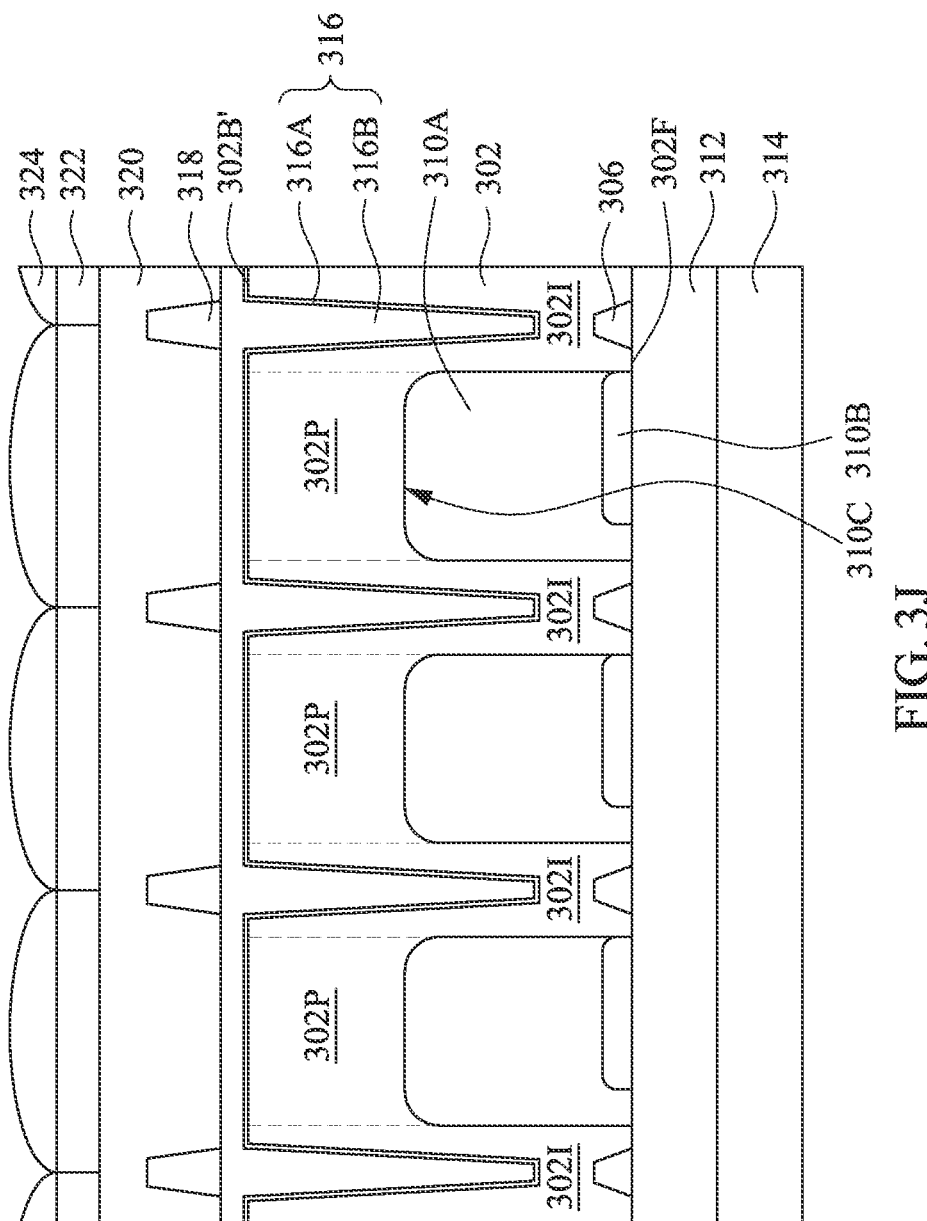

Thereafter, as shown FIG. 3J, a color filter layer 322 is formed over the dielectric layer 320, and then a microlens layer 324 is formed over the color filter layer 322. The color filter layer 322 is formed for allowing light components in a particular wavelength band to penetrate therethrough and blocking unwanted light components. The passing wavelength band of the color filter layer 322 may be a red light wavelength band, a green light wavelength band a blue light wavelength band, or combinations thereof, but is not limited thereto. Infrared light may pass through the color filter layer 322 and be absorbed in the semiconductor substrate 302. The color filter layer 322 may be formed form a material, such as pigment-based polymer, dye-based polymer, resin and another suitable material, and may be formed by a coating process or another suitable process. The microlens layer 324 is formed having a convex shape at its light receiving side for improving light receiving efficiency. The microlens layer 324 may be formed from glass, acrylic polymer or another suitable material with high transmittance, and may be formed by a spin-on process, a CVD process, a PVD process, and/or another suitable process.

In accordance with some embodiments, an image sensor device includes a semiconductor substrate, a radiation sensing member, a device layer and a trench isolation. The semiconductor substrate has a front side surface and a back side surface opposite to the front side surface. The radiation sensing member is in a photosensitive region of the semiconductor substrate, and extends from the front side surface of the semiconductor substrate. The radiation sensing member includes a semiconductor material with an optical band gap energy smaller than 1.77 eV. The device layer is over the front side surface of the semiconductor substrate and the radiation sensing member. The trench isolation is in an isolation region of the semiconductor substrate and extending from the back side surface of the semiconductor substrate.

In some embodiments, the semiconductor material is germanium or silicon germanium.

In some embodiments, the semiconductor material is gallium arsenide, indium phosphide, gallium antimonide, cadmium telluride, indium arsenide or indium antimonide.

In some embodiments, the semiconductor substrate includes silicon.

In some embodiments, a thickness of the semiconductor substrate is substantially in a range from 1.5 µm to 8 µm.

In some embodiments, a thickness of the radiation sensing member is substantially greater than 100 nm.

In some embodiments, a width of the radiation sensing member is substantially in a range from 0.9 µm to 3 µm.

In some embodiments, the image sensor device further includes a metal grid and a dielectric layer. The metal grid is over the back side surface of the semiconductor substrate and the trench isolation. The dielectric layer is over the back side surface of the semiconductor substrate and the metal grid.

In some embodiments, a width of the trench isolation is in a range from 0.1 µm to 0.5 µm.

In some embodiments, the image sensor device further includes a carrier substrate that is over the device layer.

In accordance with certain embodiments, a method of forming an image sensor device includes the following steps. A semiconductor substrate is provided, which has a front side surface and a back side surface opposite to the front side surface. A photosensitive region of the semiconductor substrate is etched to form a recess. A semiconductor material is deposited on the semiconductor substrate to form a radiation sensing member filled in the recess. An optical band gap energy of the semiconductor material is smaller than 1.77 eV. A device layer is formed over the front side surface of the semiconductor substrate and the radiation sensing member. A trench isolation is formed in an isolation region of the semiconductor substrate. The trench isolation extends from the back side surface of the semiconductor substrate.

In some embodiments, the semiconductor material is formed from germanium or silicon germanium.

In some embodiments, the semiconductor material is formed from gallium arsenide, indium phosphide, gallium antimonide, cadmium telluride, indium arsenide or indium antimonide.

In some embodiments, the semiconductor substrate is formed from silicon.

In some embodiments, the semiconductor material is deposited on the semiconductor substrate by performing a PVD process, an ALD process or a PECVD process.

In some embodiments, the method further includes thinning the semiconductor substrate until a thickness of the semiconductor substrate reaches a range from 1.5 µm to 8 µm.

In some embodiments, the radiation sensing member is formed having a thickness substantially greater than 100 nm.

In some embodiments, the method further includes performing a CMP process on the semiconductor material to remove a portion of the semiconductor material over the semiconductor substrate.

In some embodiments, the method further includes bonding a carrier substrate to the device layer.

In accordance with some embodiments, a method of forming an image sensor device includes the following steps. A silicon substrate is provided, which has a front side surface and a back side surface opposite to the front side surface. A photosensitive region of the silicon substrate is etched to form a recess. A germanium material is deposited on the silicon substrate to form a radiation sensing member filled in the recess. An annealing process is performed on the radiation sensing member. A device layer is formed over the front side surface of the silicon substrate and the radiation sensing member. A trench isolation is formed in an isolation region of the silicon substrate. The trench isolation extends from the back side surface of the silicon substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a semiconductor substrate having a front side surface and a back side surface opposite to the front side surface;
   etching a photosensitive region of the semiconductor substrate to form a recess and exposes an inner sidewall of the semiconductor substrate;
   depositing a semiconductor material on the semiconductor substrate to form a radiation sensing member filling the recess and in contact with the inner sidewall of the semiconductor substrate, wherein the semiconductor material has an optical band gap energy smaller than 1.77 eV;
   forming a device layer over the front side surface of the semiconductor substrate and the radiation sensing member; and
   forming a trench isolation in an isolation region of the semiconductor substrate and extending from the back side surface of the semiconductor substrate.

2. The method of claim 1, wherein the semiconductor material is formed from germanium or silicon germanium.

3. The method of claim 1, wherein the semiconductor material is formed from gallium arsenide, indium phosphide, gallium antimonide, cadmium telluride, indium arsenide or indium antimonide.

4. The method of claim 1, wherein the semiconductor substrate is formed from silicon.

5. The method of claim 1, wherein the semiconductor material is deposited on the semiconductor substrate by performing a physical vapor deposition (PVD) process, an atomic layer deposition (ALD) process or a plasma enhanced chemical vapor deposition (PECVD) process.

6. The method of claim 1, further comprising forming silicon-germanium bonds at an interface between the radiation sensing member and the semiconductor substrate prior to forming the device layer over the front side surface of the semiconductor substrate and the radiation sensing member.

7. The method of claim 1, wherein a portion of the semiconductor substrate is directly between the trench isolation and the device layer.

8. The method of claim 1, wherein a top surface of the trench isolation is at a level between a top surface and a bottom surface of the radiation sensing member.

9. The method of claim 1, further comprising performing an ion implantation process to form a pinned element in the radiation sensing member after depositing the semiconductor material on the semiconductor substrate.

10. A method comprising:
providing a silicon substrate having a front side surface and a back side surface opposite to the front side surface;
etching a photosensitive region of the silicon substrate to form a recess;
depositing a germanium material on the silicon substrate to form a radiation sensing member filling the recess;
performing an annealing process on the radiation sensing member;
forming a device layer over the front side surface of the silicon substrate and the radiation sensing member; and
forming a trench isolation in an isolation region of the silicon substrate and extending from the back side surface of the silicon substrate.

11. The method of claim 10, wherein the annealing process is performed at a temperature in a range of about 500° C. to about 600° C.

12. The method of claim 10, further comprising performing an ion implantation process to the radiation sensing member to form a pinned element in the radiation sensing member.

13. The method of claim 12, wherein the annealing process is performed prior to performing the ion implantation process.

14. The method of claim 10, wherein forming the trench isolation is such that the trench isolation is spaced apart from the germanium material.

15. A method comprising:
forming a shallow isolation structure in an isolation region of a substrate;
after forming the shallow isolation structure, forming a recess in a photosensitive region of the substrate;
depositing a semiconductive material in the recess to form a radiation sensing member in the substrate, wherein the semiconductive material and the substrate have different materials;
forming a device layer over the shallow isolation structure and the radiation sensing member; and
forming a deep isolation structure under the shallow isolation structure.

16. The method of claim 15, wherein forming the recess is such that the recess is deeper than the shallow isolation structure.

17. The method of claim 15, wherein the semiconductive material is made from germanium, silicon germanium, gallium arsenide, indium phosphide, gallium antimonide, cadmium telluride, indium arsenide, or indium antimonide.

18. The method of claim 15, wherein forming the device layer is such that the device layer is in contact with the semiconductive material and the substrate.

19. The method of claim 15, wherein forming the deep isolation structure is such that the deep isolation structure is spaced apart from the semiconductive material.

20. The method of claim 15, wherein depositing the semiconductive material is such that the semiconductive material is spaced apart from the shallow isolation structure.

* * * * *